(12) United States Patent
Casale et al.

(10) Patent No.: US 9,427,909 B2
(45) Date of Patent: Aug. 30, 2016

(54) METHOD OF GENERATING PATTERNS ON DOUBLY-CURVED SURFACES

(71) Applicant: II-VI Incorporated, Saxonburg, PA (US)

(72) Inventors: David M. Casale, Pennsauken, NJ (US); Derek S. Rollins, Philadelphia, PA (US)

(73) Assignee: II-VI Incorporated, Saxonburg, PA (US)

( * ) Notice: Subject to any disclaimer, the term of this patent is extended or adjusted under 35 U.S.C. 154(b) by 337 days.

(21) Appl. No.: 14/215,894

(22) Filed: Mar. 17, 2014

(65) Prior Publication Data

US 2014/0265042 A1 Sep. 18, 2014

Related U.S. Application Data

(60) Provisional application No. 61/786,873, filed on Mar. 15, 2013.

(51) Int. Cl.

| | |
|---|---|
| *B23K 26/046* | (2014.01) |
| *B29C 59/16* | (2006.01) |
| *B23K 26/08* | (2014.01) |
| *B23K 26/00* | (2014.01) |
| *G03F 7/20* | (2006.01) |
| *B23K 26/36* | (2014.01) |
| *B29C 35/08* | (2006.01) |
| *G03F 7/24* | (2006.01) |

(52) U.S. Cl.
CPC ......... *B29C 59/165* (2013.01); *B23K 26/0066* (2013.01); *B23K 26/0084* (2013.01); *B23K 26/0823* (2013.01); *B23K 26/362* (2013.01); *G03F 7/704* (2013.01); *G03F 7/70383* (2013.01); *B29C 2035/0827* (2013.01); *B29C 2035/0833* (2013.01); *B29C 2035/0838* (2013.01); *B29C 2791/009* (2013.01); *B29K 2995/0005* (2013.01); *B29K 2995/0006* (2013.01); *G03F 7/24* (2013.01)

(58) Field of Classification Search
CPC .......... B23K 26/0066; B23K 26/0084; B23K 26/046; B23K 26/0823; B23K 26/362; B29C 59/16; B29C 59/165; B29C 2035/0827; B29C 2035/0833; B29C 2035/0838; B29C 2791/009; B29K 2995/0005; B29K 2995/0006; G03F 7/70383; G03F 7/704; G03F 7/24
USPC ....... 264/400, 446, 447; 219/121.68, 121.69, 219/121.72, 121.73; 430/311, 319, 320, 430/322, 325
See application file for complete search history.

(56) References Cited

U.S. PATENT DOCUMENTS

| | | | |
|---|---|---|---|
| 4,388,388 A | 6/1983 | Kornbau et al. | |
| 4,999,277 A | 3/1991 | Haddock et al. | |
| 5,344,729 A | 9/1994 | Akins et al. | |
| 5,472,828 A | 12/1995 | Akins et al. | |
| 5,633,105 A | 5/1997 | Jensen et al. | |
| 5,650,249 A | 7/1997 | Dull et al. | |
| 6,518,936 B1 | 2/2003 | Dull | |
| 7,242,365 B1 | 7/2007 | Boatman et al. | |
| 7,557,769 B2 | 7/2009 | Picard et al. | |
| 7,979,144 B2 | 7/2011 | Rajendran et al. | |
| 8,017,308 B2 | 9/2011 | Hogue et al. | |
| 8,056,474 B2 | 11/2011 | Sedberry et al. | |
| 8,130,167 B2 | 3/2012 | Glabe et al. | |
| 2009/0206066 A1 | 8/2009 | Rekowski | |
| 2013/0009846 A1 | 1/2013 | Freitag et al. | |

*Primary Examiner* — Leo B Tentoni
(74) *Attorney, Agent, or Firm* — The Webb Law Firm

(57) ABSTRACT

Disclosed is a system and method for patterning internal and/or external doubly-curved surfaces by use of a light source, three-dimensional scanning optics, computer controller, and a multi-axis robot. The system is capable of digitally receiving shape, location, and pattern data of a three-dimensional doubly-curved surface and applying said pattern over large areas with high precision in a seamless fashion.

20 Claims, 9 Drawing Sheets

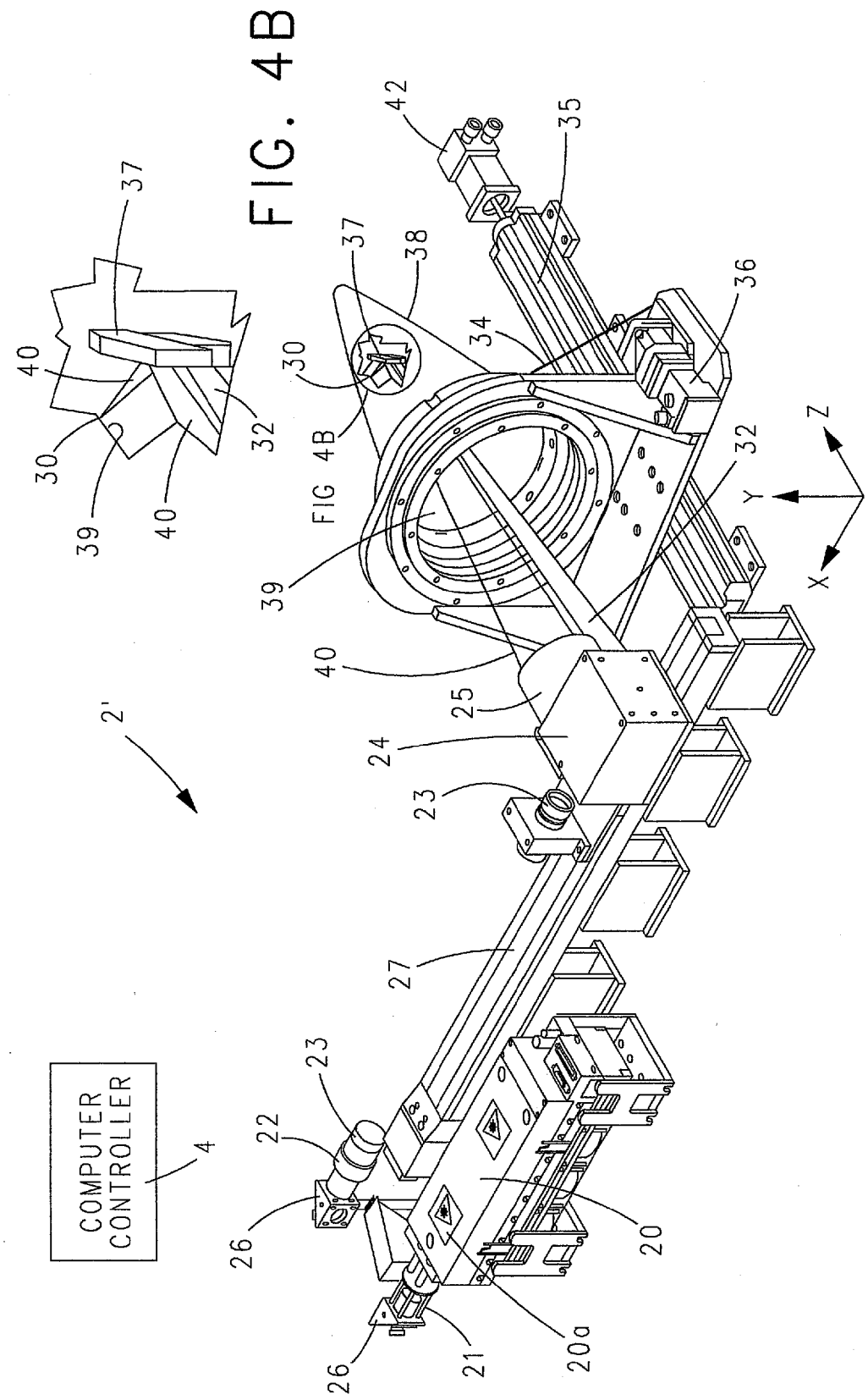

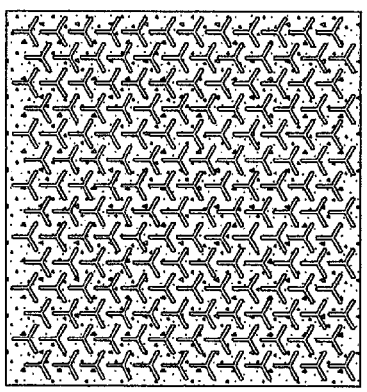
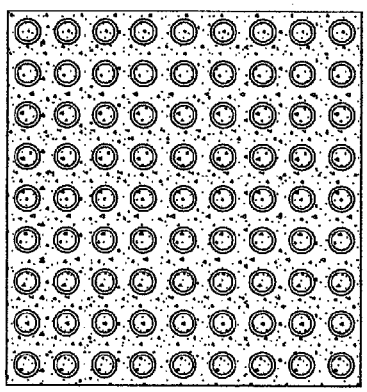
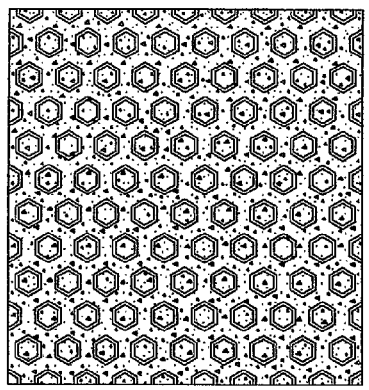
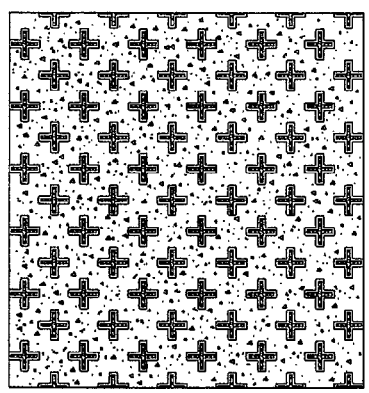
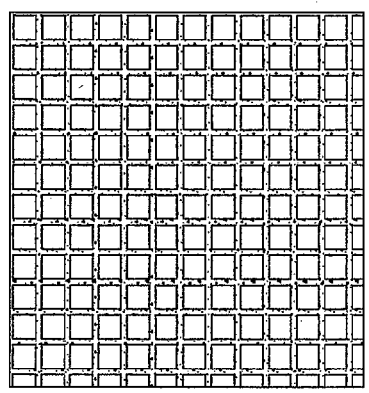
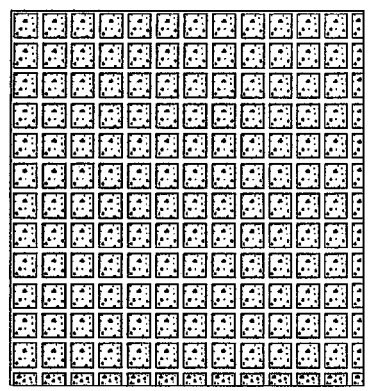
FIG. 6

METHOD OF GENERATING PATTERNS ON DOUBLY-CURVED SURFACES

CROSS REFERENCE TO RELATED APPLICATION

This application claims priority to U.S. Provisional Application No. 61/786,873, filed Mar. 15, 2013, which is incorporated herein by reference.

BACKGROUND OF THE INVENTION

1. Field of the Invention

The present invention relates to electric or electronic circuits which are generated on a curved surface, especially a doubly-curved surface. The invention is especially useful for generating circuits requiring high precision, robust materials (high temperature or harsh environments), or multilayered designs where the circuits are stacked or embedded in additional dielectric or conductive layers. The invention is capable of generating conductive and dielectric patterns on otherwise undevelopable (doubly curved) three-dimensional surfaces.

2. Description of Related Art

In the aerospace and defense industries conformal electrical circuits are desirable for a variety of electrical means with regards to electromagnetic energy and radio frequency (RF) energy. RF energy is commonly used for communications, may be used for imaging in the form of millimeter waves, and also includes various radar tracking frequencies. Circuit patterns may be placed on the surface, or embedded within, the structure of aircraft or other vehicles. The circuits are suitable for radome structures of aircraft and missiles, so that antennas or target seeking electronics may be environmentally protected while providing suitable transparency over the frequency band required by the electronics enclosed within the radome. Certain circuit designs or patterns are capable of transmitting specific frequencies of RF energy, while reflecting extraneous frequencies, thereby acting as an RF filter. Other circuit designs may have a broad shielding effect, acting as an EMI shield, where alternative designs may require multiple layers of patterned circuits of varying materials for reflective, transmissive, or attenuating functions. These are also suitable for surfaces which require a reduced radar cross section (stealth).

In the applications described above, the circuit must be of high precision and continuous for the circuit to perform as designed. Such circuits can be applied to a large variety of base substrates including, but not limited to: polymers, polymer composites, glasses, glass-ceramics, monolithic ceramics, reinforced ceramics, and ceramic matrix composites (CMCs). Patterning techniques and materials should be amenable to the substrate as well as the operating conditions experienced by the substrate, such as high temperatures generated during prolonged high speed flight of a missile.

The prior art of splicing flat sheets of etched conductors onto curved surfaces is undesirable as the pattern is not continuous, gaps are present at the joints of the spliced sheets, and electrical conductivity across the surface is not maintained. With composite structures requiring multiple circuit layers, registration between layers may be difficult to maintain as the composite materials are generally opaque and layup is generally performed by hand. Additionally, missile radome structures may be exposed to extreme heat (>600° C.) in service, damaging most polymeric substrates used in the splicing methodology, requiring an alternative approach.

In the prior art where an individual element is transferred from an optical mask onto a three-dimensional surface using laser ablation or exposure of photoresist and etching, i.e. photolithography, the speed at which elements can be generated on the part is limited by the speed of the multi-axis robot used to orient the patterning tool. This type of system is capable of producing seam free patterns in a step and repeat fashion, but the individual elements are subject to distortion by projection errors when the image is formed on the three-dimensional surface. As the curvature varies, the size of the individual elements will change substantially because of focal differences within the small field of view. Additionally, this technique is only amenable to repetitive patterns, and not for circuits requiring continuous, variable, or tailored patterns over large areas. This technique is insufficient for patterning on the inside of long, small diameter, missile radome structures as the robotic positioning system and image projection system is unable to orient normal to the interior surface due to space constraints, with focal distances being relatively short for high resolution features.

SUMMARY OF THE INVENTION

Disclosed herein is a three-dimensional direct write system capable of defining a plurality of elements across a large field of view using an ablative or actinic light source and multi-axis galvanometer scan system with appropriate optics for converging the light to a single focal point in three-dimensional space using software generated three-dimensional vector data and a system controlled by a computer controller. The direct write system scans a single focused beam of light across three-dimensional surfaces at a high rate of speed and with high precision, allowing for rapid patterning of large areas without translational movement of conventional machine tools. The direct write system may be coupled with additional multi-axis robots, for manipulation of the part and/or the direct write system, to coordinate patterning functions and robot motion to eliminate seams along the patterned surface. The system is also capable of patterning the interior of mostly enclosed surfaces, such as missile radomes, by reflection of the converging beam of light off of an appropriately positioned mirror to project the light perpendicular to the interior surface. The patterned surface may be large and continuous primarily in two-dimensions, rotationally symmetric about an axis, or of arbitrary shape and form. The direct write system is suitable for a wide variety of materials including photoimageable polymers, physical vapor deposited thin films, ceramic thick films (cermets), electrodeposited films, and ablative materials. The invention does not require a photomask (or optical mask) or original phototool to be fabricated, so adjustments to the part design can be made easily during manufacturing, without generating new costly tooling.

More specifically, disclosed herein is a method of forming a pattern on a doubly-curved surface comprising: (a) providing a substrate having a doubly-curved surface mounted for rotation about an axis of the substrate; (b) providing an optical system in relation to the substrate, the optical system operative for projecting a focal point of light to different points of the doubly-curved surface that are different distances from focusing optics of the optical system; and (c) under the control of a software controlled computer controller, rotating the substrate about its axis in coordination with the operation of the optical system to move the focal point of light in a pattern on the doubly-curved surface.

In the method, step (c) can include adjusting the focusing optics to maintain the focal point of light in focus on the different points of the doubly-curved surface that are at different distances from the focusing optics.

The doubly-curved surface can comprise a conductive film on a dielectric. Step (c) can include ablating the conductive film in the pattern on the dielectric. The conductive film can be polymer based and the method can further include curing the polymer based conductive film after ablation.

The conductive film can be an uncured ceramic and the method can include sintering the uncured ceramic conductive film after ablation.

The doubly-curved surface can comprise a photoresist on a conductive film on a dielectric. Step (c) can include exposing the photoresist in the pattern on the conductive film.

The method can further include, following step (c), photolithographically processing the photoresist and the conductive film to define a circuit on the dielectric.

The optical system can include in the following order: a light source; an attenuator; a beam expander; the focusing optics; a galvanometer; and a focusing objective. Alternatively, the optical system can further include a mirror after the focusing objective.

The method can further include translating the substrate toward and away from the focusing objective.

The method can further include translating the galvanometer toward and away from the focusing optics.

The doubly-curved surface can be either an interior surface of the substrate or an exterior surface of the substrate.

Also disclosed is a method of forming a pattern on a doubly-curved surface comprising: (a) causing a focal point of a light beam to appear at a first point on a doubly-curved surface; (b) changing a focal length of the light beam in step (a); and (c) causing the focal point of the light beam changed in step (b) to appear at a second point on the doubly-curved surface.

The method can further include: (d) changing the focal length of the light beam in step (c); and (e) causing the focal point of the light beam changed in step (d) to appear at a third point on the doubly-curved surface, wherein the first, second, and third points are at different focal lengths of the light beam.

The doubly-curved surface can have, at each of the first and second points, a first radius of curvature in first direction and a second radius of curvature in second, orthogonal direction.

The method can further include rotating or translating the surface relative to a propagation direction of the light beam.

Steps (b) and (d) can further include changing a propagation direction of the light beam relative to the surface.

Steps (b) and (d) can include at least one of the following: changing the focal point of the light beam in a Z-axis; and changing the propagation direction of the light beam in an X-axis, a Y-axis, or both X- and Y-axes.

The pattern can be formed by the focal points of light by ablation of a material.

The pattern can be formed by the focal points of lights exposing a photoresist.

BRIEF DESCRIPTION OF THE DRAWINGS

FIG. 4A is a perspective view of the multi-axis direct write system of FIG. 3A;

FIG. 4B is an enlarged, isolated view of the additional reflective mirror of the multi-axis direct write system of FIG. 4A shown through the cut-away section of the substrate in FIG. 4A;

FIG. 6 shows exemplary patterns capable of being generated by the multi-axis direct write systems described herein;

DETAILED DESCRIPTION OF THE INVENTION

The present invention will be described with reference to the accompanying figures where like reference numbers correspond to like elements.

Figure 1:
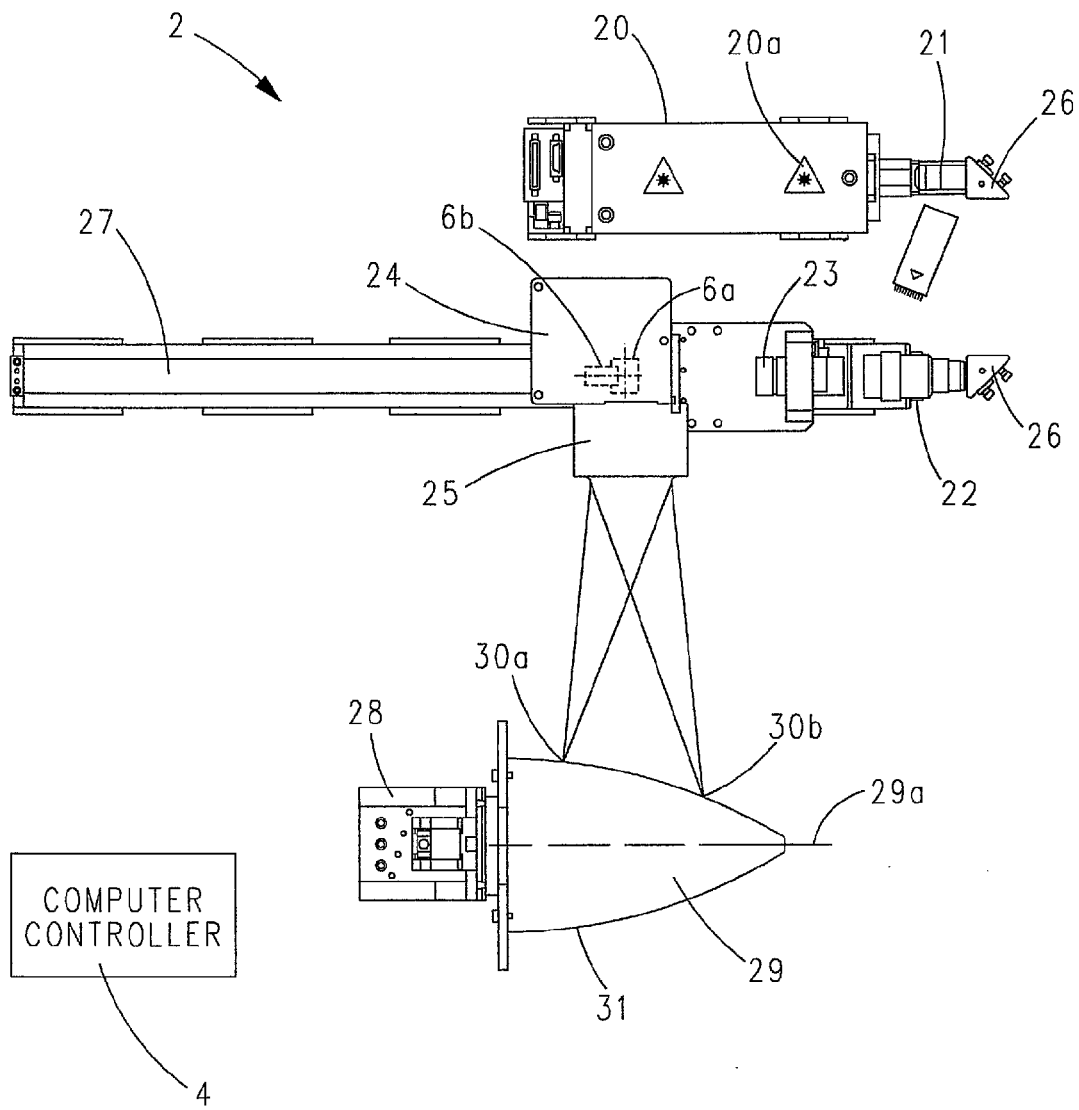
FIG. 1 is a top view showing an embodiment multi-axis direct write system including an optical system for forming a pattern on a doubly-curved external surface of a substrate.
Figure 2:
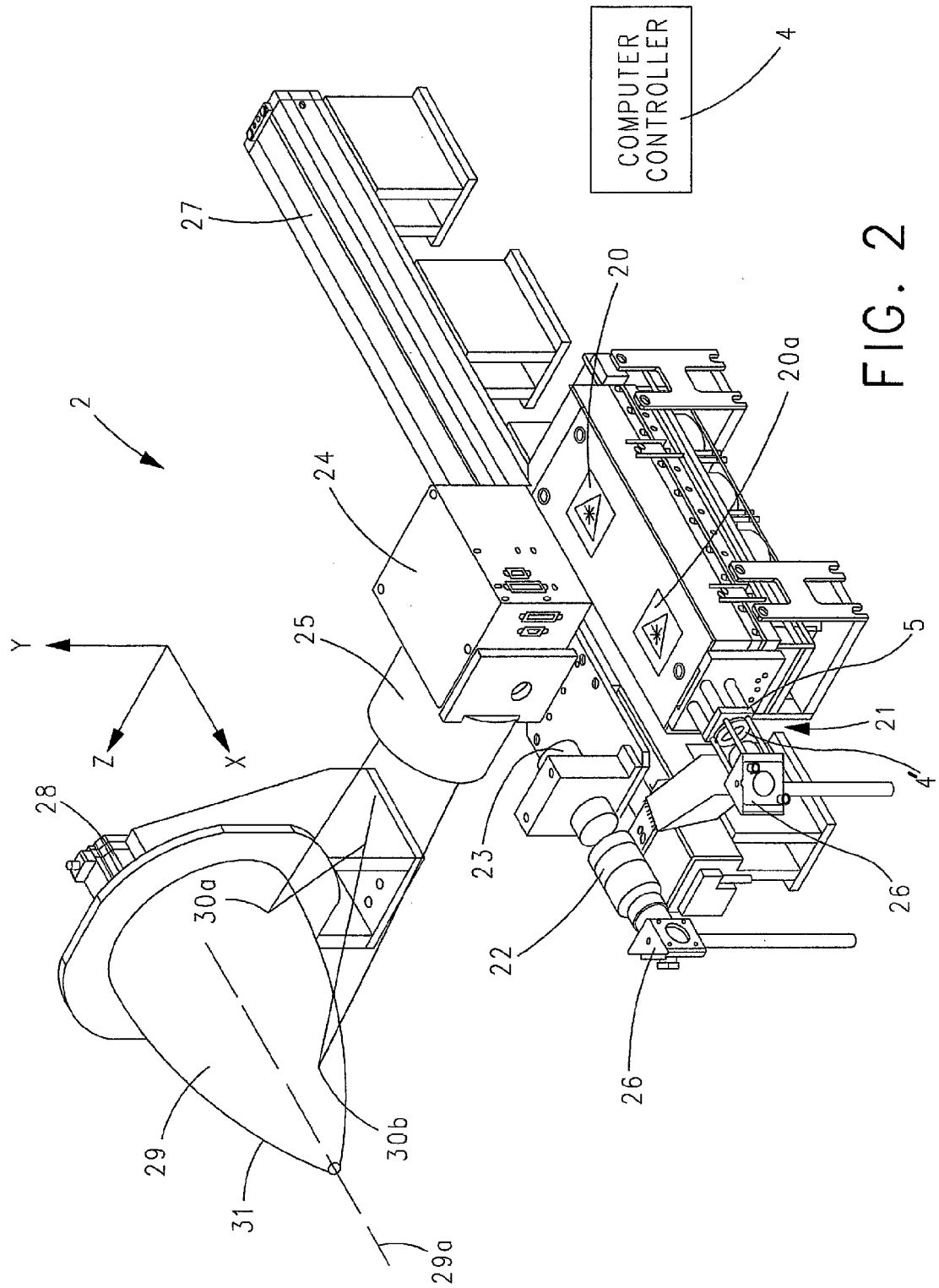
FIG. 2 is a perspective view of the multi-axis direct write system of FIG. 1.
Figures 3A, 3B:
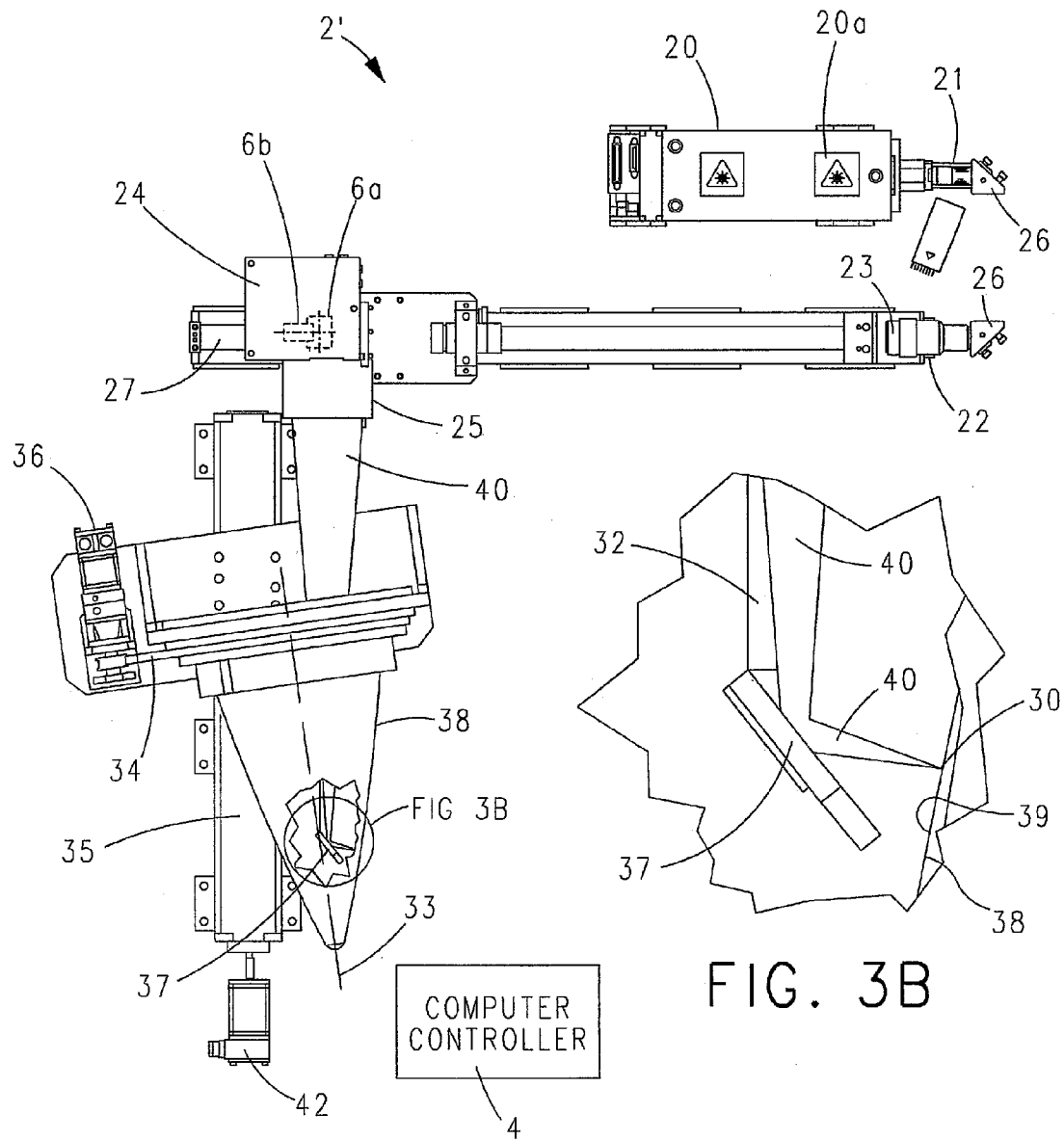
FIG. 3A is a top view of an embodiment multi-axis direct write system including an optical system similar to the optical system of FIG. 1 but including an additional reflective mirror for forming a pattern on a doubly-curved internal surface of a substrate.
FIG. 3B is an enlarged, isolated view of the additional reflective mirror of the multi-axis direct write system of FIG. 3A shown through the cut-away section of the substrate in FIG. 3A.

FIGS. 1-2 depict a multi-axis direct write system or robot 2 capable of patterning a rotationally symmetric, ogive (doubly-curved) surface 29 of a substrate 31, e.g., a dielectric radome. As used herein, "doubly-curved" means a surface which from a point thereon has a first radius of curvature in one direction (e.g., an X direction) and a second radius of curvature in a second, orthogonal direction (e.g., a Y direction).

Figure 5:
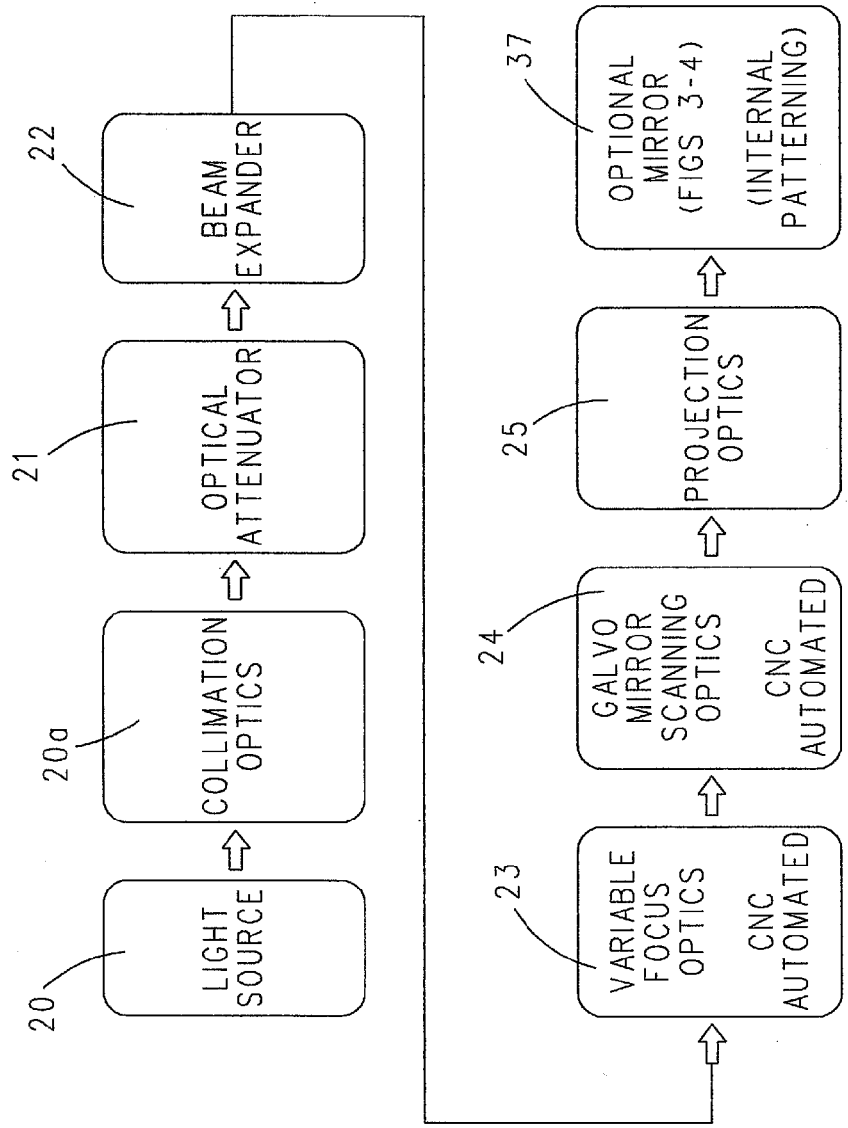
FIG. 5 is a flow diagram showing the progression of a light beam through components or elements of the multi-axis direct write systems described herein.

A flow chart of the light propagation through an optical system of system 2 (and system 2' shown in FIGS. 3A-4B) is shown in FIG. 5. In an exemplary case, the dielectric being patterned is a high temperature ceramic composite with low dielectric constant and loss tangent.

System 2 includes a light source 20 which may be an incoherent broadband light source, such as an ultraviolet mercury arc lamp; a monochromatic light source, such as light emitting diode (LED); or a coherent laser source with either continuous wave or pulsed output with pulse widths between milliseconds and femtoseconds. Typical lasers suitable for use in system 2 include solid state Nd:YAG lasers of the first, second, and third harmonic frequencies, with output wavelengths of 1064 nm, 532 nm, and 355 nm respectively, but not limited to such. Other suitable laser sources include $CO_2$ lasers, $YVO_4$ lasers, or other chemical, gas, solid state, semiconductor, excimer, or fiber lasers.

Light source 20 desirably includes collimating optics 20a for collimating the light output by light source 20.

The light propagating from light source 20 and collimating optics 20a will proceed to an attenuator 21 located along the optical axis of light source 20. Attenuator 21 may be operated under the control of a computer controller 4 and, in the case of light source 20 being linearly polarized light, attenuator 21 includes a half wave plate 4' and a polarizer 5. Attenuation by attenuator 21 is controlled by the rotational orientation of half wave plate 4' relative to polarizer 5 with minimum attenuation at 0° and maximum attenuation at 45° with respect to a fast axis of polarizer 5. In the case of light source 20 outputting incoherent light, attenuator 21 may be a variable gradient absorber, such as a grayscale patterned chromium coated wheel.

Adjustable mirrors 26 of system 2 steer the propagating light beam to a beam expander 22 which increases the size of the incoming light beam and collimates it to ensure a final spot size of the light beam is controlled and consistent. The collimated light beam exiting beam expander 22 propagates via a variable focus optics 23 that is controlled by computer controller 4 to a galvanometer (galvo) scan head 24 moveably disposed on a linear axis 27 of travel positioned relative (desirably parallel) to the original direction of light output by light source 20, thereby eliminating spot size errors caused by divergent light travelling substantial distances.

The collimated light beam entering variable focus optics 23 may be changed under the control of computer controller 4 to a divergent or convergent state, shifting the final focal plane (or focal point) of the light to a longer or shorter focal distance, respectively. Under the control of computer controller 4, variable focus optics 23 provides Z axis (depth) control along the optical axis with high speed and precision, enabling three-dimensional pattern.

The light beam entering the galvanometer (galvo) scan head 24 is deflected by two internal, orthogonally oriented, rotational mirrors 6a and 6b (show in phantom in FIG. 1), having their respective rotation axes aligned with the X and Z axes of system 2. Rotational motion of mirrors 6a and 6b is controlled under the control of computer controller 4 to angularly displace the beam of light in the X-axis and/or Y-axis prior to incidence on a focusing objective 25. The focusing objective 25 may be a plano optic, a simple focusing lens, an f-theta flat field lens, or an f-theta telecentric lens.

Excluding the plano optic, the focusing objective 25 provides the final working focal point 30 of light of system 20, which focal point 30 may be shifted along the optical Z axis by variable focus optics 23 under the control of computer controller 4, as shown by focal points 30a and 30b. In the case of plano optic, the size/shape of focal point 30 is controlled solely by variable focus optics 23 under the control of computer controller 4.

The location of focal point 30 on substrate 31 can be controlled in the X-axis and/or Y-axis direction by deflecting galvanometer 24 mirrors 6a and 6b at high speed along a planned path corresponding with a desired pattern of focal point 30 on substrate 31. The focal point 30 of light is projected, and scanned across the external surface 29 of substrate 31, using coordinated motion of galvanometer 24 mirrors 6a and 6b, variable focus optics 23, a rotational stage 28 supporting substrate 31 for rotation about an axis 29a of substrate 31, and galvanometer 24 on linear axis 27. The coordinated motion of galvanometer 24 mirrors 6a and 6b, variable focus optics 23, rotational stage 28, the movement of galvanometer 24 along linear axis 27 and, optionally the on/off operation of light source 20 is coordinated under the control of computer controller 4 which includes hardware elements, such as a microprocessor and memory, and software elements which facilitate the operation of system 2 in the manner described herein. More specifically, each mirror 6a and 6b of galvanometer 24 is individually rotatable under the control of computer controller 4; variable focus optics 23 is controllable under the control of computer controller 4 to adjust the distance of focal point 30 along the Z axis of system 2; rotational stage 28 is operative under the control of computer controller 4 to rotate substrate 31 about axis 29a, desirably parallel to an X axis of system 2; and the location of galvanometer scan head 24 along linear axis 27 is operative under the control of computer controller 4 to move focal point 30 to desired locations on the surface 29 of substrate 31. It is to be understood that suitable motors or drives, not shown in the figures for the purpose of simplicity, are provided to facilitate the operation of galvanometer 24 mirrors 6a and 6b, variable focus optics 23, rotational stage 28, and/or the location of galvanometer 24 along linear axis 27 under the control of computer controller 4 in the manner described above. Rotational stage 28 includes a motor and necessary hardware for supporting substrate 31 for rotation about axis 29a.

The patterning of the surface 29 of substrate 31 may be done in a seamless fashion under the control of computer controller 4, whereupon adjoining segments are patterned across surface 29 and stitched together at junctions of the patterns. Individual features of the pattern may be adjusted using patterning software that runs on and controls the operation of computer controller 4. For an exemplary diffraction limited optical system using a 355 nm laser, a 500 mm focal length f-theta objective, and an initial beam diameter of 14 mm, the final size of the focal point 30 at the surface 29 of substrate 31 will be approximately 18.5 µm, small enough for most high frequency electromagnetic applications of substrate 31 when used as a dielectric radome. In one exemplary, non-limiting embodiment, the field of view that may be scanned by galvanometer 24 mirrors 6a and 6b can be in excess of 250 mm×250 mm in the X and Y directions of system 2, with a variable focal depth of focal point 30 of 500 mm±120 mm along the optical Z axis, defining the working volume of system 2. An exemplary system 2 of this type is capable of direct writing at a speed in excess of 600 mm/sec.

Another embodiment system 2' shown in FIGS. 3A-4B (similar in most respects to system 2 in FIGS. 1-2) may be used to pattern an interior surface 39 of a three-dimensional object (substrate 38) that is otherwise obscured to conventional machine tools and optical systems. In system 2', the optical system includes an additional mirror 37 located on the end of a support arm 32 that extends from galvanometer (galvo) scan head 24 such that the light beam 40 output from focusing objective 25 is reflected off of mirror 37, orienting light beam 40 substantially normal to the interior surface 39 of substrate 38. By orienting light beam 40 substantially normal to the interior surface of substrate 38, the light beam itself is not subject to projection errors on the doubly-curved interior surface 39 of substrate 38, which may cause an otherwise circular focal point 30 to appear elliptical. Mirror 37 may be stationary as depicted, or mounted on an additional multi-axis robot (not shown) for patterning free-form surfaces.

In system 2', substrate 38 to be patterned is mounted for rotation about its rotational axis 33 via an internal patterning rotational motor 36, belt drive 34, and a related support structure which is stacked and can translate on a linear axis 35 via a drive motor 42 under the control of computer controller 4 to position and orient substrate 38 relative to the galvanometer scan head 24 and mirror 37. With a suitably long focal length objective 25, the interior surface of substrate 38 may be patterned if the working volume required to reach the substrate is within the limits achievable by some combination of the optical system of system 2' and mechanical motion available.

In addition to computer controller 4 coordinating the motion of galvanometer 24 mirrors 6a and 6b, variable focus optics 23, and the position of galvanometer 24 and focusing objective 25 along the length of linear axis 27, computer controller 4 can also be operative for controlling rotational motor 36 and drive motor 42, all in a coordinated manner to have focal point 30 form a desired pattern on the interior surface 39 of substrate 38. To this end, computer controller 4 can be programmed in such a way as to form a desired pattern on the interior surface 39 of substrate 38 by controlling galvanometer 24 mirrors 6a and 6b, variable focus optics 23, the position of galvanometer scan head 24 and focusing objective 25 along the length of linear axis 27, and the operation of rotational motor 36 and drive motor 42 in coordination with the optional on/off operation of light source 20 to produce a desired pattern on the interior surface of substrate 38.

FIG. 6 shows a number of two-dimensional representations of typical patterns 50-55 that may be applied to three-dimensional or doubly-curved surfaces that define a circuit, such as the exterior surface 29 of substrate 31 and/or the interior surface 39 of substrate 38. These patterns can include highly conductive frequency selective patterns depicted in 50-53, and highly conductive complimentary grids depicted in 54 and 55. The frequency selective patterns may be a tripole in a hexagonally close-packed array 50, circular loops in a square array 51, hexagons in a close-packed array 52, or loaded cross-elements on an offset array 53. Other types of center connected elements 50, loop elements 51-53, plate elements 55, or any combination of these elements on a variety of lattices may be patterned as typical frequency selective patterns via system 2 or system 2'. Additionally, conductive grids 54 may be formed to act as an EMI grid. In a case where highly conductive materials are replaced with a lossy, or resistive, material, the frequency selective patterns 50-53 may be treated as circuit analog absorbers for alternative applications, and the complimentary grid patterns 54-55 as tailored resistive or impedance structures. Other types of patterns may be formed and used, including arbitrary or randomized patterns of elements or lines of varying width, length, or position. With system 2 or system 2', seams created when performing prior art patterning may be avoided by the direct write function of the system.

Figure 7:
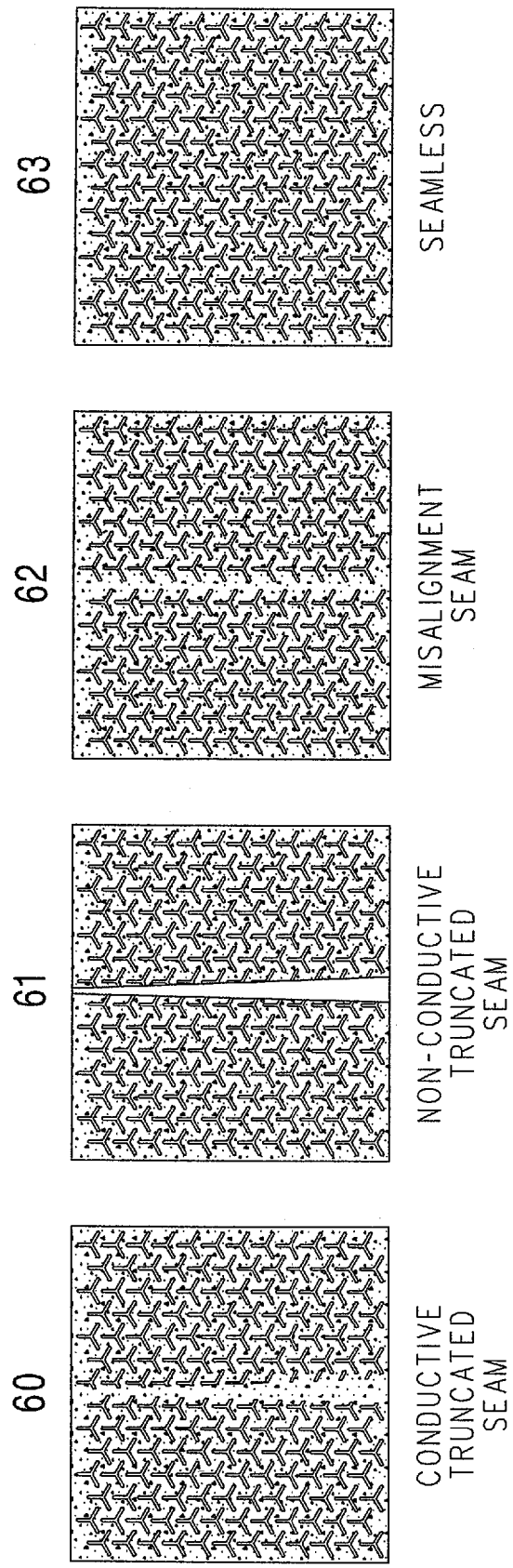
FIG. 7 shows three exemplary seam pattern errors produced in accordance with the prior art that are avoided by the multi-axis direct write systems described herein and an exemplary seamless, error-free pattern that can be produced by the multi-axis direct write systems described herein.

FIG. 7 shows a number of two-dimensional representations of typical patterns 60-62 that may be applied to a three-dimensional or doubly-curved surface depicting seaming errors for a typical frequency selective surface that may degrade the performance of substrate 31 and/or substrate 38. Seam errors include conductive seams 60, non-conductive gaps 61, misaligned seams 62, and in the worst case an overlapping seam (not shown) where two patterns are present. The seamless pattern 63 shown in FIG. 7 is desired and may be required in some applications.

Figure 8:
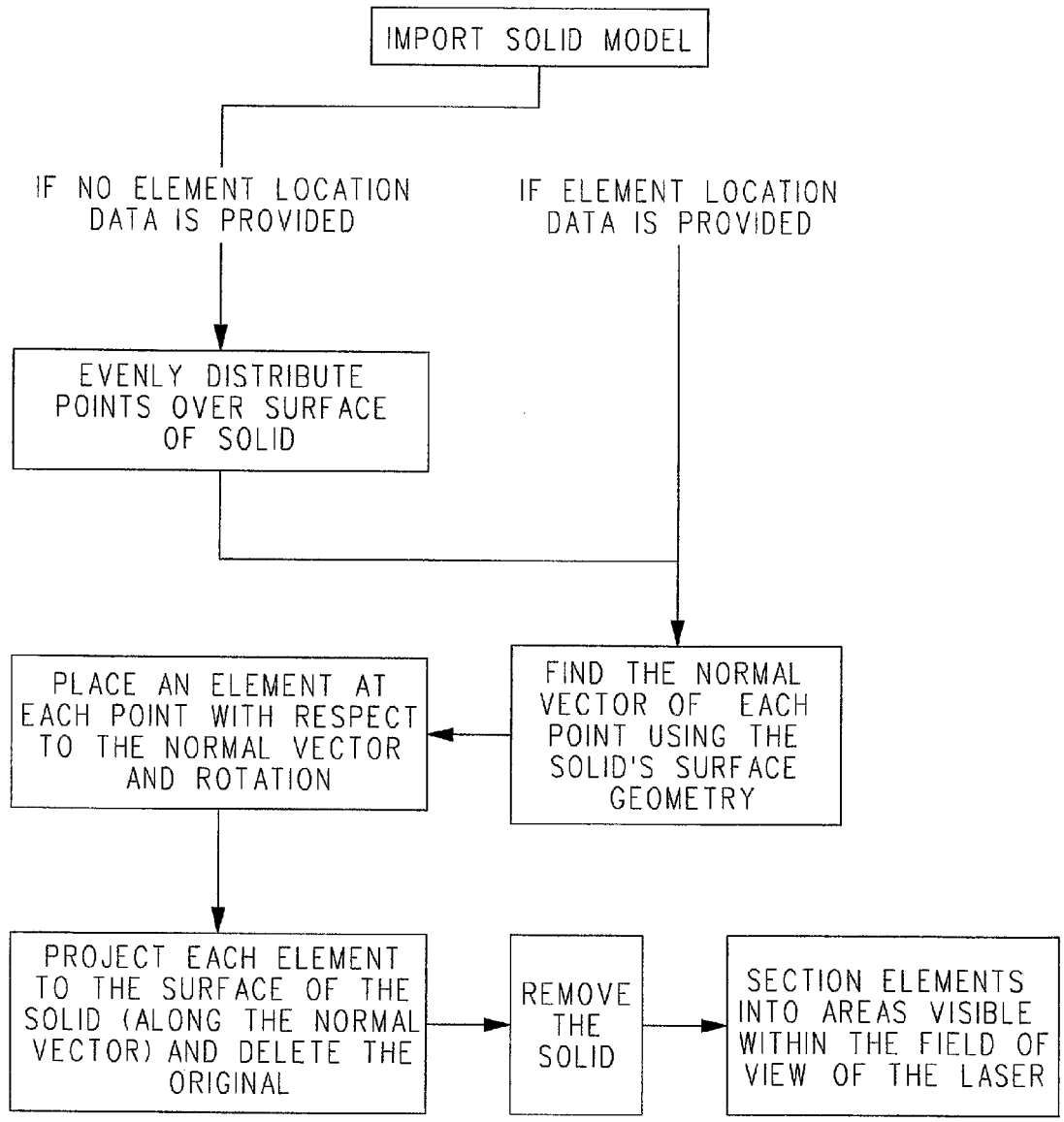
FIG. 8 is a flow diagram showing program flow for distributing points over a surface via the multi-axis direct write systems described herein.

FIG. 8 is a flow chart of an automated process of defining elements over a three-dimensional or doubly-curved surface prior to patterning. In this process, a solid model is defined and imported into a computational software program to distribute points in software over a three-dimensional surface of the solid model representative of the physical surface on which the pattern is to be formed. The program distributes the points in a specific manner, either in a square, offset square, hexagonal, or other grid type. The points are used as the vertices for connected lines, or as center points for individual elements. When acting as the center point for an arrayed element, the normal vector for each point is calculated at the point's intersection with the solid model. A two-dimensional element is placed at that point and projected onto the surface of the three-dimensional surface of the solid model along the calculated normal vector. After projection, the original two-dimensional element is removed, leaving the three-dimensional element projected on the surface of the three-dimensional solid model. This is repeated across the surface until every element is completed. Upon completion, the three-dimensional solid model is removed, leaving only the vector three-dimensional elements defining the desired pattern. This pattern may then be sectioned in preparation for use by computer controller 4 in the three-dimensional system 2 or 2', which will form the pattern(s) using the generated data.

More specifically, after completion of the evenly distributed vector three-dimensional elements defining the desired pattern on the solid model, additional processing may be performed using traditional computer aided design (CAD) suites. This processing may be included to aid in the visualization of the distributed elements, for error checking, and to perform any changes required to streamline the manufacturing process. Such changes may include changing an element width or length, hatching of selected areas, and partitioning of pattern data into sections that can be readily processed by system 2 or 2'. The data is then exported from the CAD suite as a common vector exchange file, such as .dxf, .hpgl, or .3ds, to then be used by the three-dimensional direct write software program element that runs on computer controller 4.

Light source 20 and the orientation of rotation mirrors 6a and 6b of galvanometer scan head 24 are controlled by computer controller 4 operating under the control of the software with a graphical user interface. The software running on computer controller 4 controls the light output by light source 20, as well as the position of each mirror 6a and 6b of galvanometer scan head 24 at a very high rate. The software running on computer controller 4 is also capable of importing the three-dimensional data from the CAD suite, and saving it in a native vector format. This three-dimensional data is processed by the software, and the axes of mirrors 6a and 6b of galvanometer scan head 24 are controlled and compensated using a correction file to account for any aberrations within the optical system (FIG. 5) requisite for focusing the light to a focal point 30 at precise locations on the doubly-curved surface 29 or 39 of substrate 31 or 38. The optical correction file is configured to correct for errors in all three dimensions, maintaining precise focusing of the light from light source 20 to a focal point 30 at any point on the doubly-curved surface 29 or 39 of substrate 31 or 38 within the field of view. The software also controls the speed for the vector paths, as well as providing limited pattern adjustment capabilities, similar to the three-dimensional CAD suite.

Figure 9:
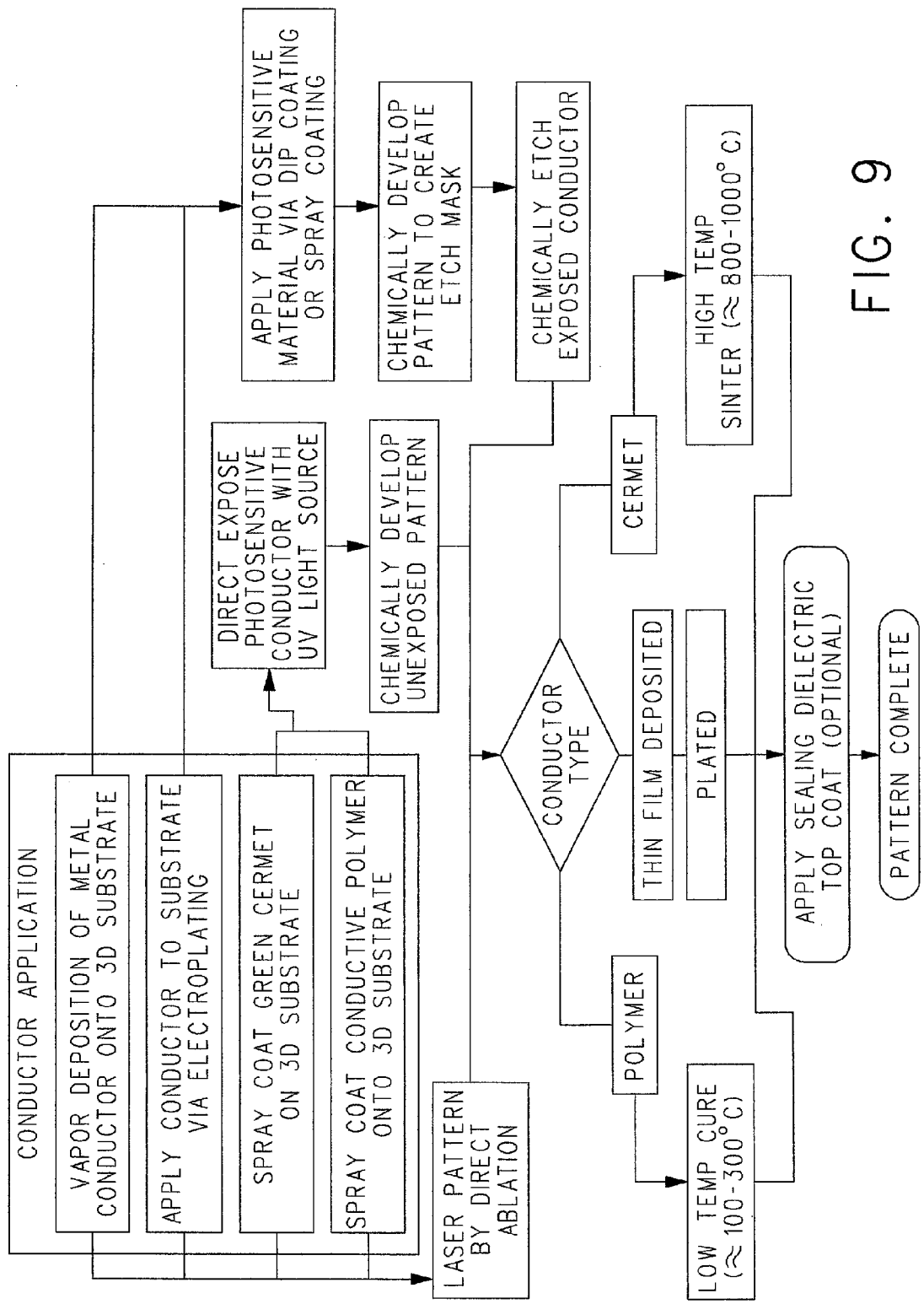
FIG. 9 is a flow diagram showing optional process flows for applying conductors and patterning doubly-curved surfaces via the multi-axis direct write systems described herein.

Several different, alternative, processing techniques may be used to form a pattern on doubly-curved surfaces, as shown by the flow chart in FIG. 9. Initially, the doubly-curved surface to be patterned is coated with a conductive film in any suitable and/or desirable manner. The conductive film can be comprised of noble metals such as gold, silver, platinum, palladium, or alternative metals such as aluminum, nickel, tungsten, molybdenum, titanium, copper, or alloys of any of the above. The conductive film may have temporary or permanent binders such as epoxy, polyimide, polyurethane, sinterable glass, ethyl cellulose, or polymethylmethacrylate (PMMA), as well as additional processing aids. The conductive film may not be conductive when initially applied, and may require additional processing.

Filled polyimides are exemplary low temperature polymer based conductors, with cermet as an exemplary high temperature conductor. The surface to be patterned may be made conductive by physical or chemical vapor deposition, electroplating, electroless plating, spray coating, dip coating, or by other means. If the coated conductive surface is to be ablated directly by a laser source, the coated surface may be patterned directly after coating without any additional treatment. If the coating material is polymer based it must be fully cured after ablation. In the case of a thin film or electroplated conductor the pattern is complete and robust after ablation. In the case of a green state (uncured) ceramic conductor or cermet that is laser ablated to define the circuit, the ceramic conductor must be sintered after ablation to attain full conductivity and robustness of the applied pattern.

In a case where the pattern will be defined by actinic or UV light, the surface is exposed using system 2 or 2' and then developed in a method similar to photolithography. The conductor material may be directly patterned, as is the case for UV sensitive conductive polymers or similarly designed cermets and cured at the appropriate temperatures for low temperature or high temperature systems. System 2 or 2' may also be used to perform traditional photolithography in three dimensions. In this case, a photosensitive polymer layer (photoresist) is applied to the conductive film. A UV source is used to expose the photoresist in a desired pattern, the photoresist is then developed to reveal the underlying conductive material which is then etched to define the circuit. Any remaining photoresist may then be removed using a suitable solvent. In all of the above cases, additional dielectrics may be applied to protect or tune the electrical circuit. With a low temperature system the dielectric will often be a polymeric, where a high temperature system will use a glass, ceramic, or glass ceramic for the dielectric coating. If multiple layer circuits are required, the processes may be performed serially for each layer.

One application where this invention is utilized is in the patterning of conductive materials which are robust enough to survive elevated temperatures (800-1200° C.). In order to survive these environments a thick layer of conductive metal is used. Typically this metal layer includes a significantly thick plated layer of conductor or a thick-film cermet (ceramic-metal hybrid) material. Due to the robust properties of the material, the energy and time required to properly ablate the material with a laser source is very high. Additionally, due to the high energy involved in the ablation process, it becomes increasingly difficult to remove the conductive layer without damaging the underlying substrate. The preferred approach utilized with system 2 or 2' is to laser ablate a thick film cermet material in its uncured or green state prior to the final sintering step. To utilize this process the cermet material must have a viscosity that permits it to be applied via a spray application (less than 1.0 centipoise). The required viscosity is obtained by the addition of solvents to the base cermet material. Once the proper viscosity has been obtained, the liquid cermet material is sprayed onto the doubly-curved surface which is to be patterned. The use of heat and computer controlled robotics during the spray process ensures that the conductor is applied evenly and without large beads.

Once the cermet material is sprayed onto the surface to be patterned it is subsequently dried at a temperature of 150° C. to remove any additional low temperature solvents. At this point the cermet is considered to be in the "green" (or uncured) state and has sufficient toughness and rigidity that it can be handled safely without damaging the applied material. Once loaded onto the three-dimensional patterning system 2 or 2', the green state cermet is laser ablated to define the desired pattern without damaging the underlying substrate material. Since the laser system is not ablating the actual metal, but instead simply breaking the weak green-state polymer bonds, the energy required to remove the cermet is greatly reduced when compared to the energy required to ablate fully cured cermet or sufficiently thick plated conductors. This low energy allows for rapid ablation which decreases the required patterning time by a minimum of 10× when compared to traditional conductor ablation technologies. Upon completion of the laser patterning, the patterned cermet is placed into a furnace and sintered to a temperature between 800° C. and 1200° C., melting the ceramic glass material within the cermet and fully hardening the material. During this sintering process the conductive cermet will experience some shrinkage. This reduction in overall conductive material volume is a repeatable phenomenon and it can be accounted for during the initial patterning step in order to create the correct final pattern size.

The present invention has been described with reference to the accompanying figures. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of forming a pattern on a doubly-curved surface comprising:
   (a) providing a substrate having a doubly-curved surface mounted for rotation about an axis of the substrate;
   (b) providing an optical system in relation to the substrate, the optical system operative for projecting a focal point of light to different points of the doubly-curved surface that are different distances from focusing optics of the optical system; and
   (c) under the control of a software controlled computer controller, rotating the substrate about its axis in coordination with the operation of the optical system to move the focal point of light in a pattern on the doubly-curved surface.

2. The method of claim 1, wherein step (c) includes adjusting the focusing optics to maintain the focal point of light in focus on the different points of the doubly-curved surface that are at different distances from the focusing optics.

3. The method of claim 1, wherein:
   the doubly-curved surface comprises a conductive film on a dielectric; and
   step (c) includes ablating the conductive film in the pattern on the dielectric.

4. The method of claim 3, wherein:
   the conductive film is polymer based; and
   the method further includes curing the polymer based conductive film after ablation.

5. The method of claim 3, wherein:
   the conductive film is an uncured ceramic; and
   the method includes sintering the uncured ceramic conductive film after ablation.

6. The method of claim 1, wherein:
the doubly-curved surface comprises a photoresist on a conductive film on a dielectric;
step (c) includes exposing the photoresist in the pattern on the conductive film.

7. The method of claim 6, further including, following step (c), photolithographically processing the photoresist and the conductive film to define a circuit on the dielectric.

8. The method of claim 1, wherein the optical system includes in the following order:
a light source;
an attenuator;
a beam expander;
the focusing optics;
a galvanometer; and
a focusing objective.

9. The method of claim 8, wherein the optical system further includes a mirror after the focusing objective.

10. The method of claim 8, further including translating the substrate toward and away from the focusing objective.

11. The method of claim 8, further including translating the galvanometer toward and away from the focusing optics.

12. The method of claim 1, wherein the doubly-curved surface is either an interior surface of the substrate or an exterior surface of the substrate.

13. A method of forming a pattern on a doubly-curved surface comprising:
(a) causing a focal point of a light beam to appear at a first point on a doubly-curved surface;
(b) changing a focal length of the light beam in step (a); and
(c) causing the focal point of the light beam changed in step (b) to appear at a second point on the doubly-curved surface.

14. The method of claim 13, further including:
(d) changing the focal length of the light beam in step (c); and
(e) causing the focal point of the light beam changed in step (d) to appear at a third point on the doubly-curved surface, wherein the first, second, and third points are at different focal lengths of the light beam.

15. The method of claim 13, wherein the doubly-curved surface has, at each of the first and second points, a first radius of curvature in first direction and a second radius of curvature in second, orthogonal direction.

16. The method of claim 13, further including rotating or translating the surface relative to a propagation direction of the light beam.

17. The method of claim 13, wherein steps (b) and (d) further include changing a propagation direction of the light beam relative to the surface.

18. The method of claim 17, wherein steps (b) and (d) include at least one of the following:
changing the focal point of the light beam in a Z-axis; and
changing the propagation direction of the light beam in an X-axis, a Y-axis, or both X- and Y-axes.

19. The method of claim 13, wherein the pattern is formed by the focal points of lights by ablation of a material.

20. The method of claim 13, wherein the pattern is formed by the focal points of lights exposing a photoresist.

* * * * *